US006887090B2

United States Patent
Lin et al.

(10) Patent No.: US 6,887,090 B2
(45) Date of Patent: May 3, 2005

(54) ELECTRICAL CONNECTOR WITH RETENTION CLIP

(75) Inventors: Nick Lin, Tu-chen (TW); Linjiang Cui, Kunsan (CN); Xue Bin Zhang, Kunsan (CN); Wei Yu, Kunsan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/899,597

(22) Filed: Jul. 26, 2004

(65) Prior Publication Data

US 2005/0020121 A1 Jan. 27, 2005

(30) Foreign Application Priority Data

Jul. 25, 2003 (TW) .............................. 92213602 U

(51) Int. Cl.[7] .......................................... H01R 13/625
(52) U.S. Cl. ..................................... 439/342; 439/259
(58) Field of Search ................................. 439/342, 259

(56) References Cited

U.S. PATENT DOCUMENTS

| | | | | |
|---|---|---|---|---|
| 4,426,122 A | * | 1/1984 | Lainez et al. ................ | 361/683 |
| 5,013,256 A | * | 5/1991 | Matsuoka et al. ........... | 439/264 |
| 5,057,031 A | * | 10/1991 | Sinclair ....................... | 439/261 |
| 5,443,591 A | * | 8/1995 | Tsai ............................ | 439/342 |
| 5,489,218 A | | 2/1996 | McHugh | |
| 5,595,286 A | * | 1/1997 | Schulze ....................... | 200/335 |
| 5,902,144 A | * | 5/1999 | Hay ............................ | 439/342 |
| 5,967,824 A | * | 10/1999 | Neal et al. ................... | 439/342 |
| 6,004,141 A | * | 12/1999 | Abe et al. .................... | 439/73 |
| 6,106,319 A | * | 8/2000 | Fukunaga et al. .......... | 439/342 |
| 6,280,223 B1 | | 8/2001 | Lin | |
| 6,338,639 B1 | * | 1/2002 | Trout et al. ................. | 439/342 |
| 6,527,577 B1 | * | 3/2003 | Chen et al. ................. | 439/342 |
| 2001/0000765 A1 | * | 5/2001 | Fukunaga .................... | 439/342 |
| 2004/0224548 A1 | * | 11/2004 | Yu .............................. | 439/342 |

* cited by examiner

Primary Examiner—Tho D. Ta
Assistant Examiner—Larisa Tsukerman
(74) Attorney, Agent, or Firm—Wei Te Chung

(57) ABSTRACT

An electrical connector (1) includes a housing (10), a cover (20), and an actuator (30). The base includes an extending portion (12) with a projection (1212) and a hook portion (1214) inwardly formed a top of the projection. The actuator includes an operational lever (32) and an axle (33) engaged with the operational lever. A coil spring (34) is mounted around the axle and defines a first end (342) at a free end thereof. A retention clip (60) is mounted on the projection and includes a base portion (61), a first and second extending walls (62, 63) extending from two opposite ends of the base portion. The coil spring is attached to the operational lever and rotates under force from the operational lever, and the retention clip is tightly fastened on the projection, thereby the operational lever can only be retained in a first position or a second position.

15 Claims, 9 Drawing Sheets

ELECTRICAL CONNECTOR WITH RETENTION CLIP

BACKGROUND OF THE INVENTION

1. Field of the Invention

The present invention relates to an electrical connector for electrically connecting a central processing unit (CPU) chip with a printed circuit board (PCB), and particularly to an electrical connector with an operational lever and a retention clip.

2. Description of the Prior Art

CPU sockets are widely used for electrically connecting CPUs with PCBs. A CPU socket usually comprises a base, and a cover slidably engaged on the base. An actuator actuates the cover to slide along the base, such that contact pins of the CPU are pushed to electrically mate with a multiplicity of contacts secured in the base. This kind of electrical connector is disclosed in U.S. Pat. Nos. 6,280,223 and 6,338,639.

FIG. 7 shows a conventional electrical connector 9. The connector 9 comprises a base 90, and an actuator 94 actuating the cover 92 to slide along the base 90. The cover 92 defines a plurality of passages 921 in a rectangular array. A plurality of passageways 901 is defined in the base 90, corresponding to the passages 921 of the cover 92. A plurality of terminals (not shown) is received in the corresponding passageways 901 of the base 90. An extending portion 93 extends from a rear end of the base 90. The extending portion 93 comprises a projection 932, with a hook portion 934 inwardly formed from a top of the projection 932. The actuator 94 comprises an arch-shaped cam protrusion 940, a semi-cylindrical protruding portion 946, and an operational lever 942.

Referring also FIGS. 8 and 9, in use of the electrical connector 9, the actuator 94 is firstly oriented to an open position with the cover 92 being in an open position. This enables pins of a CPU (not shown) to be inserted through the passages 921 of the cover 92 into the passageways 901 of the base 90 with zero insertion force (ZIF). Then, the actuator 94 is rotated to a closed position and is retained by the hook portion 934 of the extending portion 93, with the cover 92 sliding to a closed position. Thus, the CPU is electrically connected with the terminals of the base 90, and accordingly is electrically connected with a PCB (not shown).

In the electrical connector 9, the actuator 94 is usually rotated to the open position by means of manual operation. If a force of rotating the actuator 94 is insufficient, the cover 92 is driven only part of the way toward the open position. When the CPU is then attached on the cover 92, the pins of the CPU are received in the passageways 901 and interfere with the terminals of the base 90. The pins and the terminals are thus liable to sustain damage. As a result, the electrical connection between the CPU and the PCB is disrupted or may even fail altogether.

Therefore, a new electrical connector which overcomes the above-mentioned problems is desired.

SUMMARY OF THE INVENTION

An object of the present invention is to provide an electrical connector having a coil spring which rotates under force from an operational lever, whereby the operational lever can only be retained in a first position or in a second position.

Another object of the present invention is to provide an electrical connector configured so that the operational lever of the connector can accurately be retained in the second position.

To achieve the above objects, an electrical connector in accordance with a preferred embodiment of the present invention is for connecting a central processing unit (CPU) with a printed circuit board (PCB). The connector comprises an insulative base, a cover mounted on the base, a plurality of terminals received in the base, and an actuator. The base comprises an extending portion extending from an end portion thereof. The extending portion comprises a receiving space with a receiving groove, a receiving recess, and a receiving slot. The extending portion defines a projection protruding from an end thereof with a hook portion inwardly formed from a top of the projection. The actuator actuates the cover to slide along the base, and comprises an operational lever and an axle engaged with the operational lever. A coil spring is attached around the axle. The coil spring comprises a main body received in the receiving groove, a first end, and a second end fastened in the receiving slot. The first end of the coil spring is attached to a cutout of the operational lever and rotates under force form the operational lever. As a result, the operational lever can only be retained in a first position or in a second position. An U-shaped retention clip is locked around the periphery of the projection so that the operational lever of the connector can accurately be retained in the second position.

Other objects, advantages and novel features of the invention will become more apparent from the following detailed description when taken in conjunction with the accompanying drawings, in which:

DESCRIPTION OF THE PREFERRED EMBODIMENTS

Reference will now be made to the drawings to describe the present invention in detail.

Figure 1:
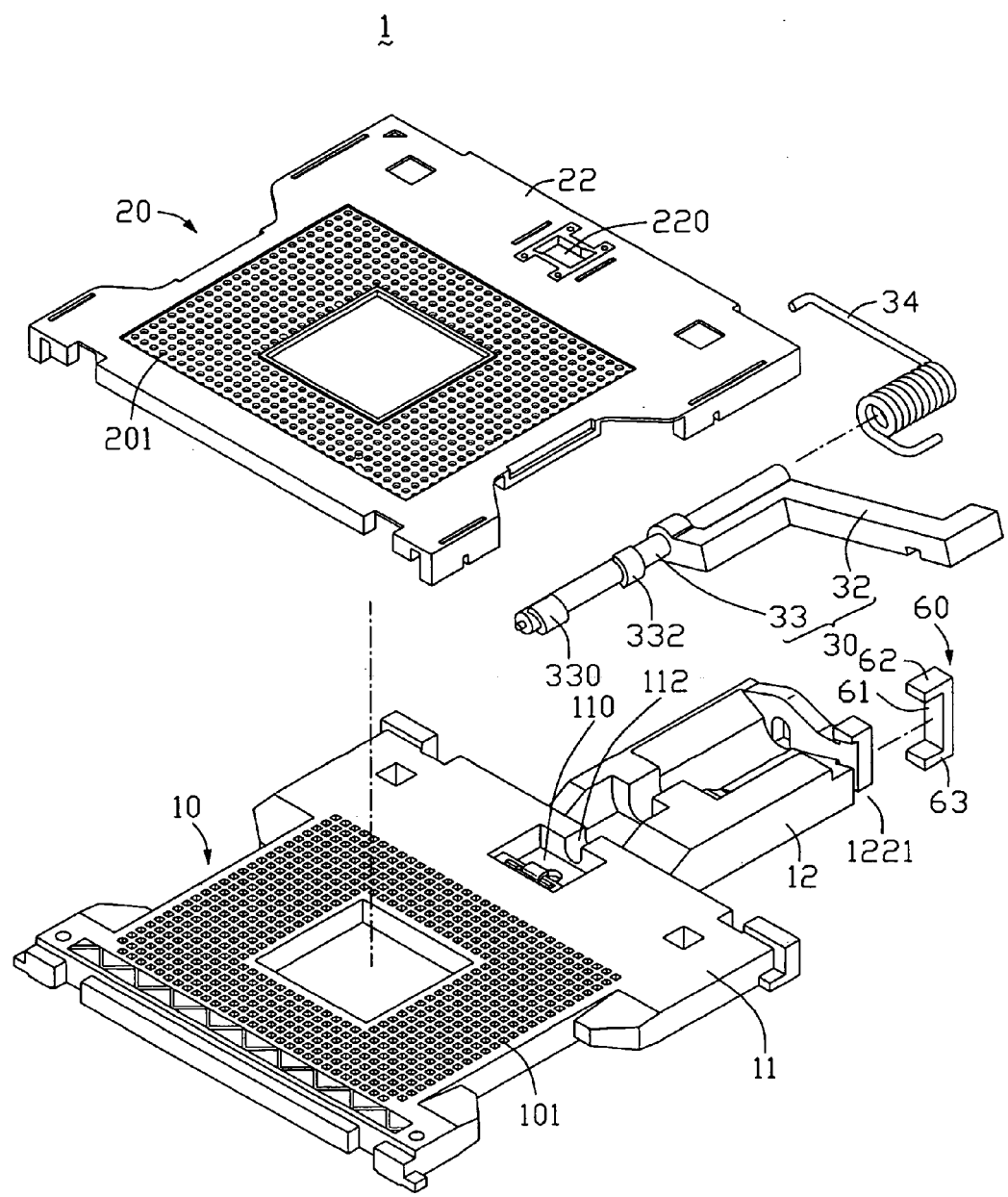
FIG. 1 is a simplified, exploded, isometric view of an electrical connector in accordance with the preferred embodiment of the present invention, but not showing terminals thereof.
Figure 2:
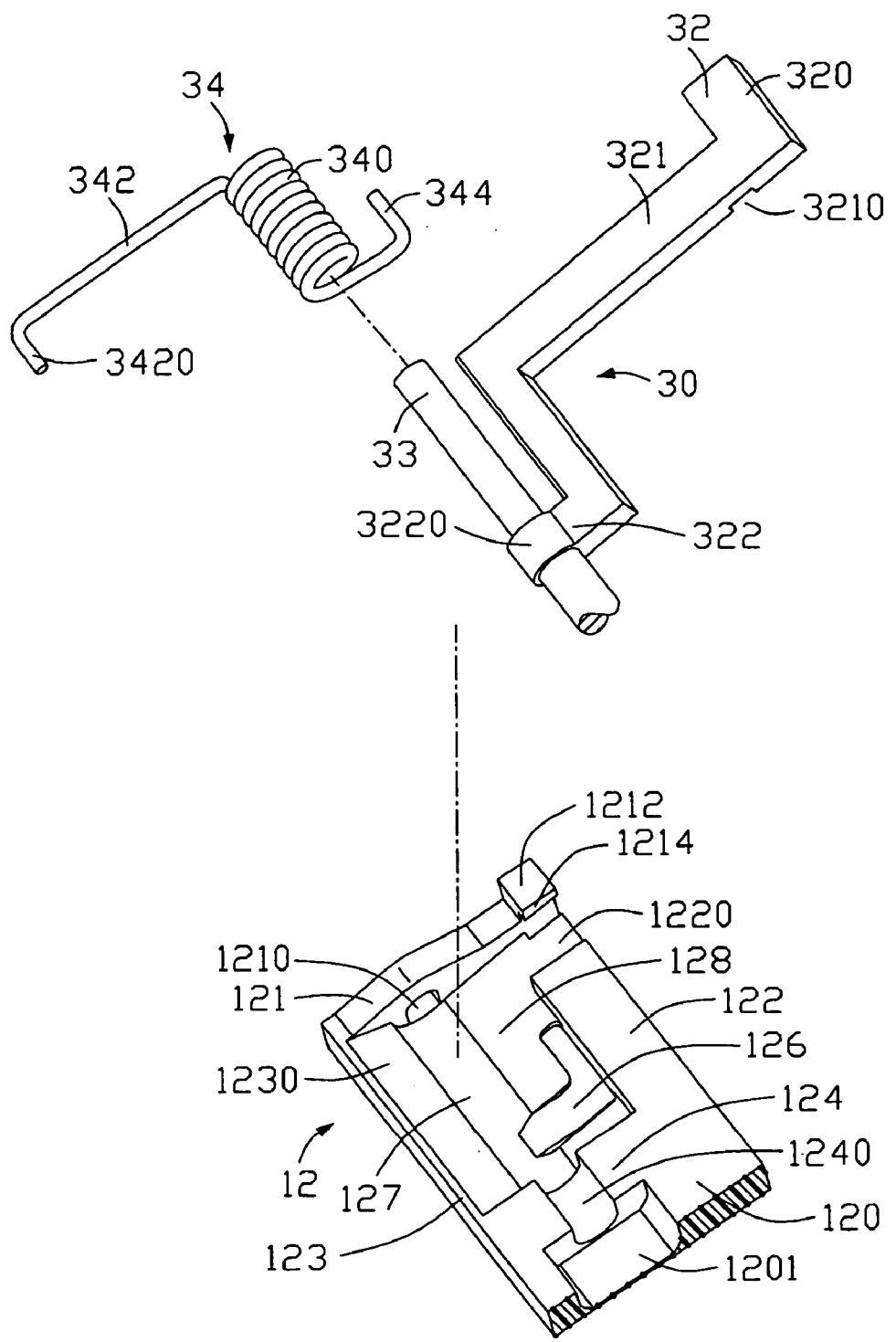
FIG. 2 is an enlarged, exploded isometric view of a part of a base, a part of an actuator, and a coil spring of the electrical connector of FIG. 1.
Figure 3:
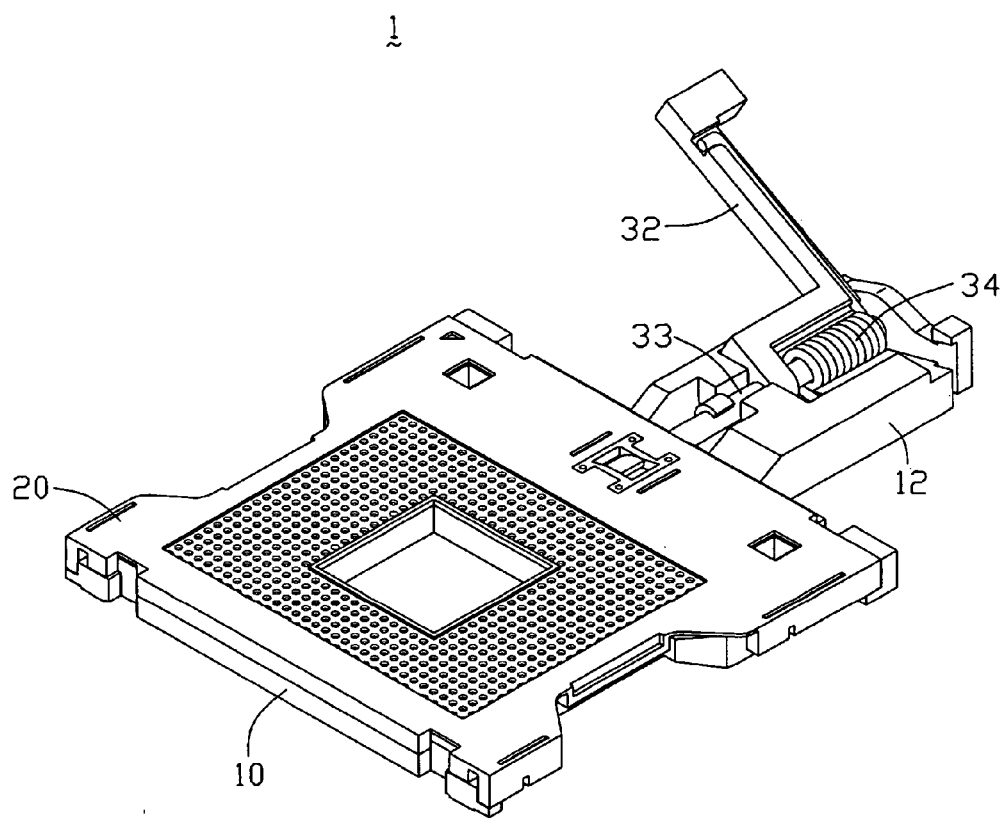
FIG. 3 is an assembled view of FIG. 1, showing a cover, the actuator and the coil spring of the electrical connector in respective first positions.

Referring to FIGS. 1, 2 and 3, an electrical connector 1 in accordance with the preferred embodiment of the present invention is used for electrically connecting an electronic package such as a central processing unit (CPU) (not shown) with a circuit substrate such as a printed circuit board (PCB) (not shown). The electrical connector 1 comprises an insulative base 10 fixed on the PCB, a rectangular cover 20 slidably mounted on the base 10, and an actuator 30 actuating the cover 20 to slide along the base 10.

The cover 20 comprises a main body (not labeled) and a broad first end portion 22. A rectangular opening (not labeled) is defined in a middle of the main body. A plurality of passages 201 is defined in the main body around the opening, the passages 201 being arranged in a rectangular array. A top hole 220 is defined in a middle of the first end portion 22.

The base 10 defines a plurality of passageways 101 corresponding to the passages 201 of the cover 20, and comprises a broad second end portion 11 corresponding to the first end portion 22 of the cover 20. A plurality of conductive terminals (not shown) is received in the passageways 101 of the base 10. A receiving recess 110 is defined in a middle of the second end portion 11, corresponding to the top hole 220 of the cover 20. An arched slot 112 is defined in a center of a rear end of the second end portion 11, in communication with the receiving recess 110. An extending portion 12 extends from a middle of the rear end of the second end portion 11.

The extending portion 12 comprises a first end wall 120 adjoining the second end portion 1, a second end portion 121 opposite to the first end wall 1200, a first sidewall 122 interconnecting the first and second end walls 120, 121, and a second sidewall 123 opposite to the first sidewall 122 and interconnecting the first and second end walls 120, 121. The first end wall 120 defines a locating recess 1201 offset from a middle portion thereof, the locating recess 1201 being in communication with the slot 112. The second end wall 121 defines a locating blind hole 1210 in alignment with the locating recess 1201. The second end wall 121 comprises a projection 1212 protruding from an end thereof and spaced apart from the locating hole 1210. A hook portion 1214 is inwardly formed from a top of the projection 1212. A guiding groove 1220 is defined in a junction of the second end wall 121 and the first sidewall 122. A securing slot 1221 is defined on a bottom face of the extending portion 12, corresponding to the guiding groove 1220. A slope 1230 is formed on a top face of the second sidewall 123. The first and second sidewalls 122, 123, and the second end wall 121 cooperatively define a receiving space (not labeled) therebetween. A transverse connection wall 124 is formed between the first and second sidewalls 122, 123, the connection wall 124 adjoining the first end wall 120. A connection slot 1240 is defined in the connection wall 124, the connection slot 1240 intercommunicating between the locating recess 1201 and the receiving space. The receiving space comprises a receiving groove 127 intercommunicating between the connection slot 1240 and the locating hole 1210, a receiving recess 128 intercommunicating between the guiding groove 1220 and the receiving groove 127, and an L-shaped receiving slot (not labeled) defined below and in communication with the receiving recess 128, and being in communication with the receiving groove 127. A retention clip 60 is mounted around the projection 1212. The retention clip 60 is U-shaped in the preferred embodiment of the present invention. However, in alternative embodiments, the retention clip 60 may have any other suitable shape. The retention clip 60 comprises a base portion 61, a first extending wall 62 and a second extending wall 63 respectively extending perpendicularly from two opposite ends of the base portion 61. The first extending wall 62 is engaged with a top face of the projection 1212, and the second extending wall 63 is received in the securing slot 1221.

The actuator 30 comprises an axle 33 and an operational lever 32. The axle 33 and the operational lever 32 are separate parts in the preferred embodiment of the present invention. Alternatively, the axle 33 and the operational lever 32 can be integrally formed as a single piece. The operational lever 32 comprises a handle 320, an L-shaped operational arm 321 extending perpendicularly from one end of the handle 320, an end portion 322 extending perpendicularly from a distal end of the operational arm 321. The operational arm 321 defines a cutout 3210 in one end thereof adjacent the handle 320. The end portion 322 comprises a hollow column 3220 at a free end thereof, the hollow column 3220 engagingly receiving the axle 33. The axle 33 has an arch-shaped cam protrusion 330 formed at one free end thereof, and a semi-cylindrical protruding portion 332 formed adjacent the operational lever 32. The cam protrusion 330 is retained in both the top hole 220 of the cover 20 and the receiving recess 110 of the base 10. The protruding portion 332 is received in the locating recess 1201 of the extending portion 12. A coil spring 34 is mounted around an opposite free end of the axle 33. The coil spring 34 comprises a main body 340 located in the receiving groove 127 of the extending portion 12, an L-shaped first end 342 extending outwardly from one end of the main body 340, and an L-shaped second end 344 extending outwardly from an opposite end of the main body 340 and received in the receiving slot 126 of the extending portion 12. The first end 342 defines a free end 3420 thereof, the free end 3420 being received in the cutout 3210 of the operational lever 32.

Referring particularly to FIG. 3, in use of the electrical connector 1, the actuator 30 is oriented to and retained in a first position. In this position, the operational lever 32 abuts against the slope 1230 of the extending portion 12, with the first end 342 of the coil spring 34 resiliently pressing on the operational lever 32 under tension of the coil spring 34. The CPU is then engaged on the cover 20, with pins of the CPU (not shown) being received through the passages 201 of the cover 20 into the passageways 101 of the base 10. The pins are received in the passageways 101 with zero insertion force (ZIF).

Figure 4:
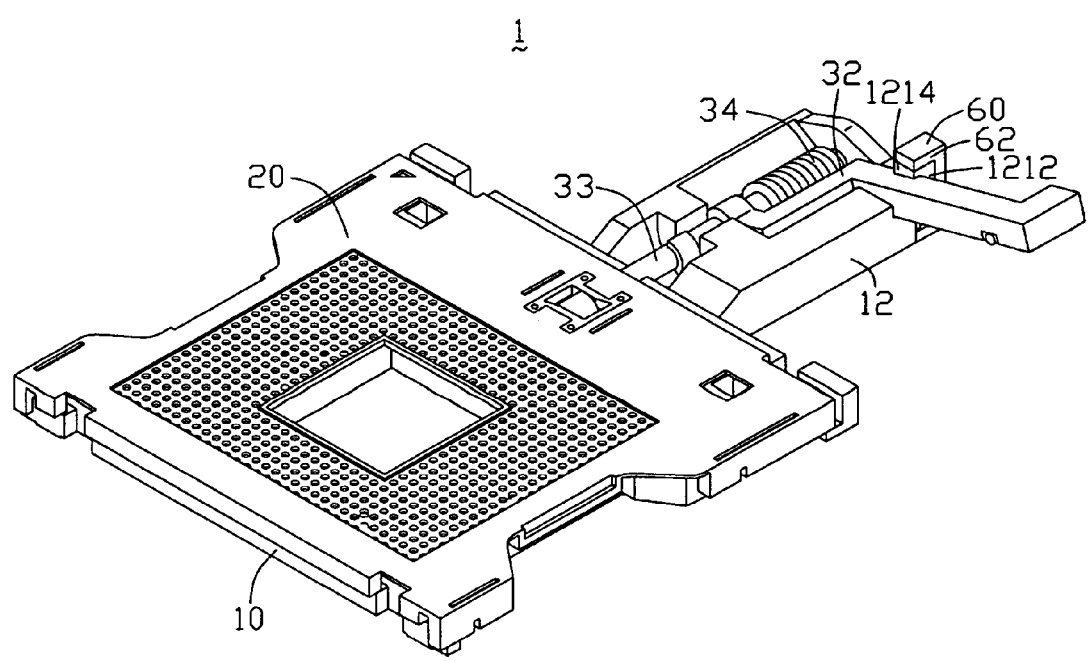
FIG. 4 is similar to FIG. 3, but showing the cover, the actuator, the coil spring and a retention clip of the electrical connector in respective second positions.

Referring to FIG. 4, the actuator 30 is rotated to a second position, in order to drive the cover 20 to slide along the base 10 so that the pins of the CPU engage with the terminals of the base 10. In the second position, the operational lever 32 is received in the receiving recess 128 and the guiding groove 1220 of the extending portion 12, the first end 342 of the coil spring 34 resiliently pressing on the operational lever 32 under increased tension of the coil spring 34, and the hook portion 1214 of the projection 1212 retains the operational arm 321 of the actuator 30 thereunder. Furthermore, the retention clip 60 is fittingly engaged with the projection 1212 of the extending portion 12. The base portion 61 of the retention clip 60 leans on the periphery of the projection 1212, the first extending wall 62 pressing on the top face of the projection 1212, and the second extending wall 63 is received in the securing slot 1221. Thus, the CPU is electrically connected with the PCB via the terminals of the base 10.

The first end 342 of the coil spring 34 rotates under force from the operational lever 32 from the first position to the second position, with the coil spring 34 undergoing steadily increasing tension during such rotation. Accordingly, the operational lever 32 can only be retained in the first position or the second position, and not in any intermediate position. Thus, the CPU can only be inserted into and removed from the electrical connector 1 when the actuator 30 is in the first position. This eliminates the possibility of the pins of the CPU interfering with the terminals of the base 10 during insertion or removal of the CPU. The pins of the CPU and the terminals of the base 10 can maintain their mechanical integrity. In addition, the retention clip 60 is provided for fittingly engaging with the projection 1212 of the extending portion 12. When the retention clip 60 is engaged with the projection 1212, the base portion 61 of the retention clip 60 leans on the periphery of the projection 1212, the first extending wall 62 pressing on the top face of the projection 1212, and the second extending wall 63 is received in the securing slot 1221. Thus the retention clip 60 is tightly fixed on the projection 1212, in order to insure reliable connection between the operational arm 321 of the actuator 30 and the hook portion 1214 of the projection 1212 so that the stable and reliable electrical connection between the CPU and the PCB is ensured.

Figure 5:
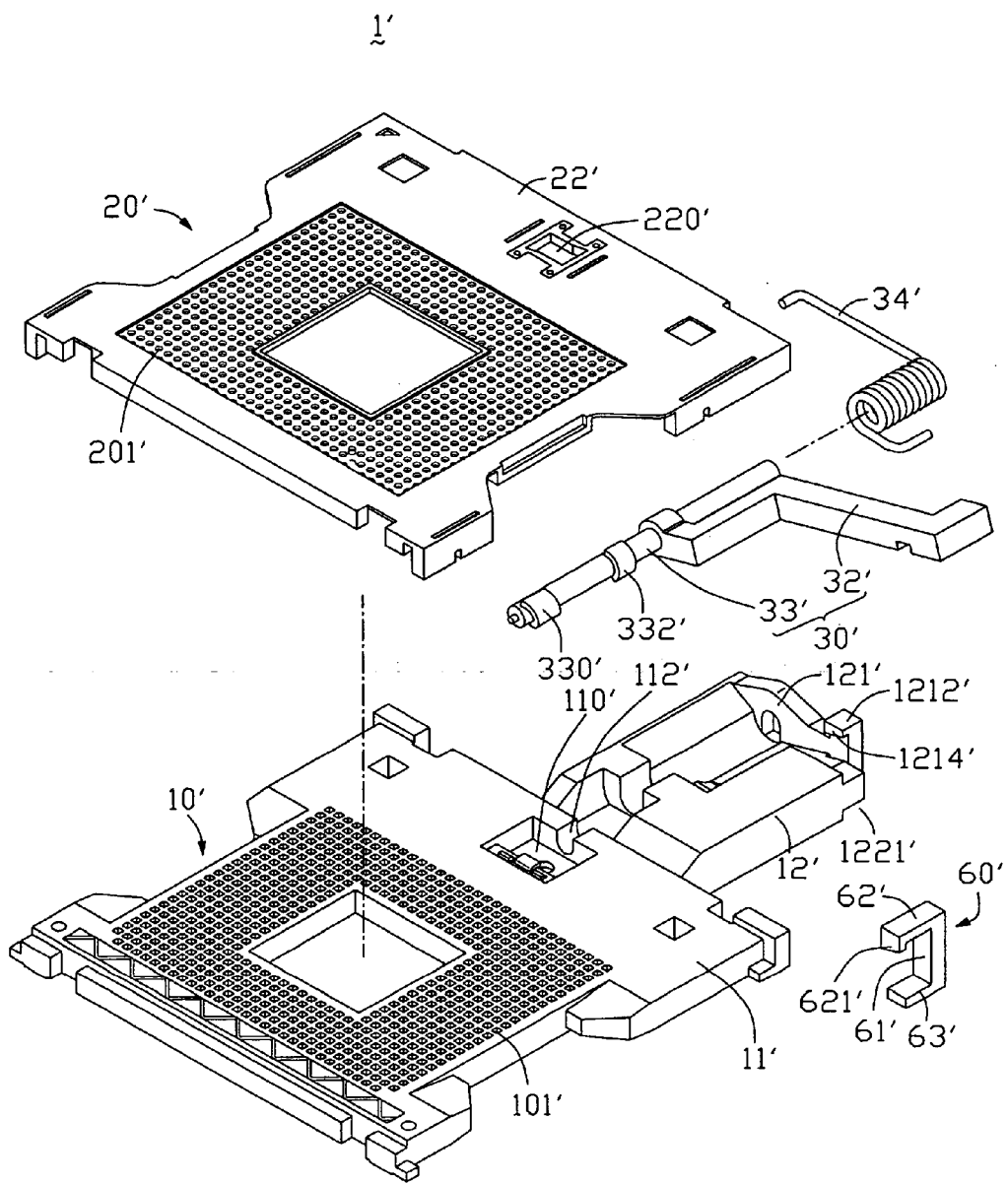
FIG. 5 is a simplified, exploded, isometric view of an electrical socket in accordance with an alternative embodiment of the present invention.
Figure 6:
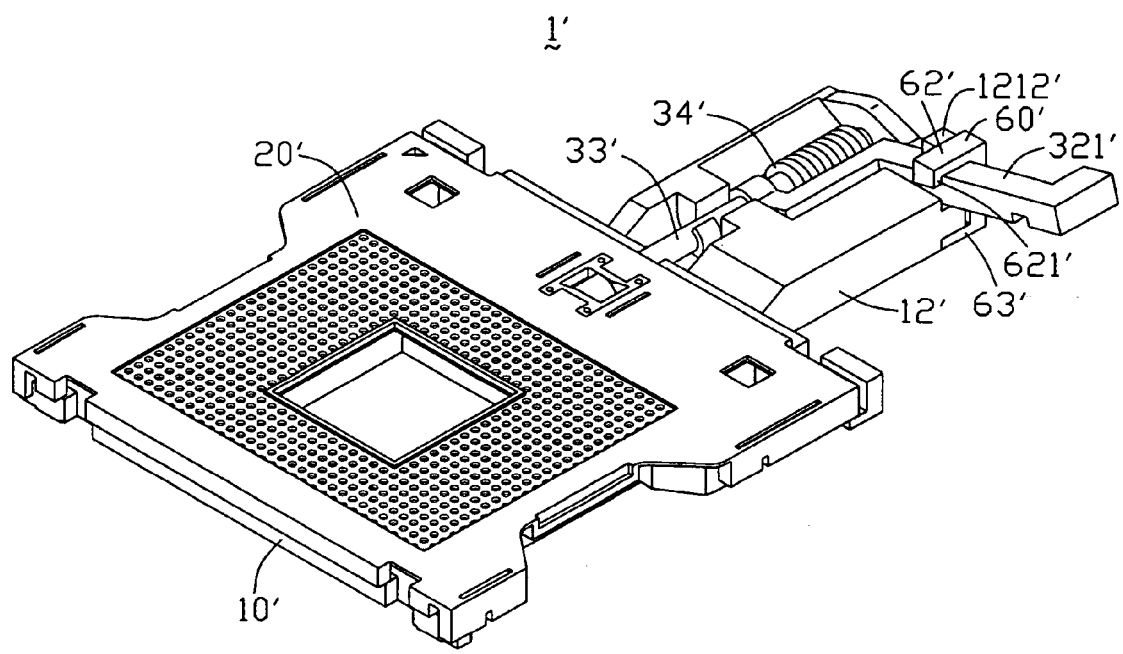
FIG. 6 is an assembled view of FIG. 5, showing a cover, an actuator, a coil spring and a retention clip of the electrical connector in respective second positions.
Figure 7:
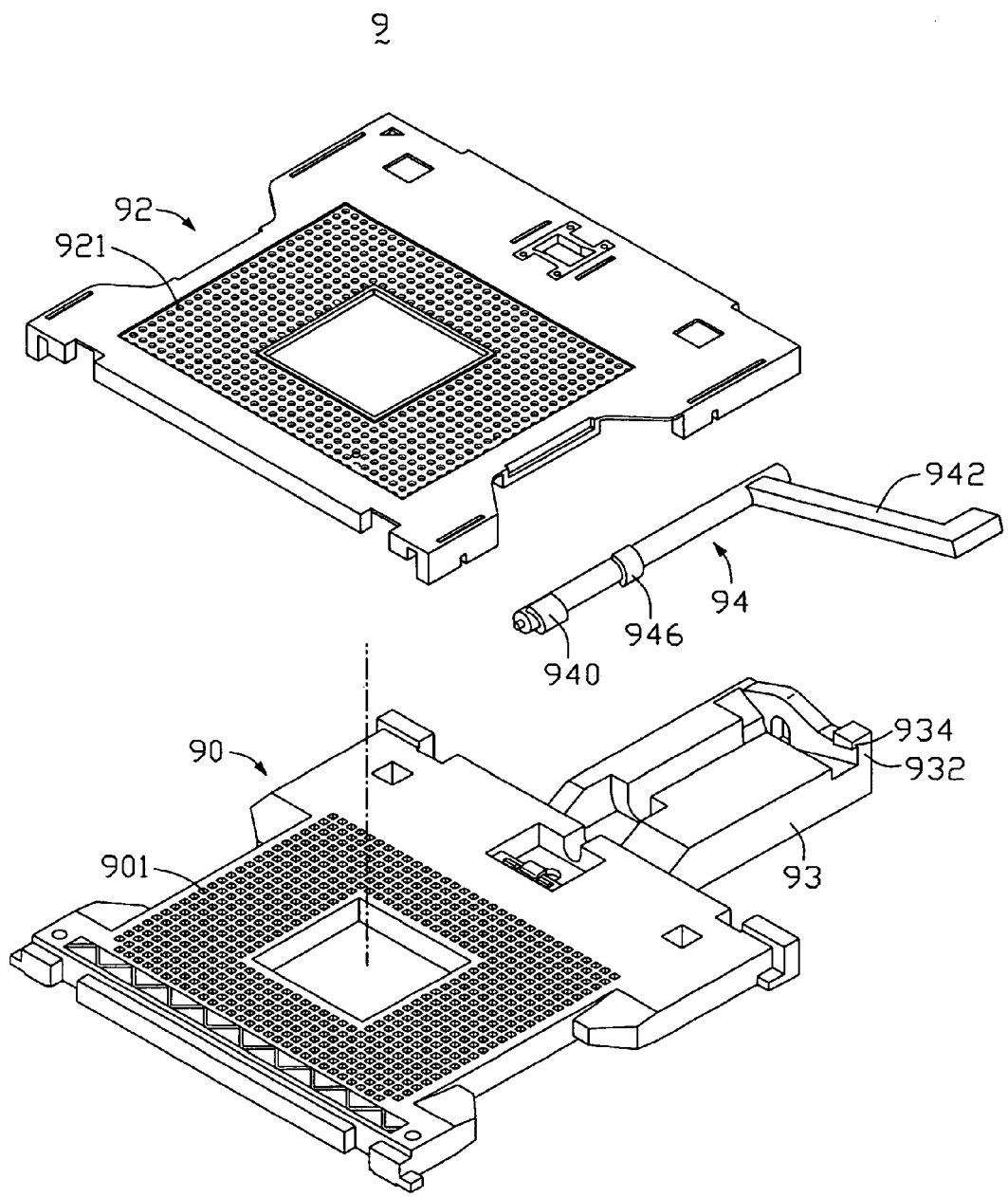
FIG. 7 is an exploded, isometric view of a conventional CPU socket electrical connector, but not showing terminals thereof.
Figure 8:
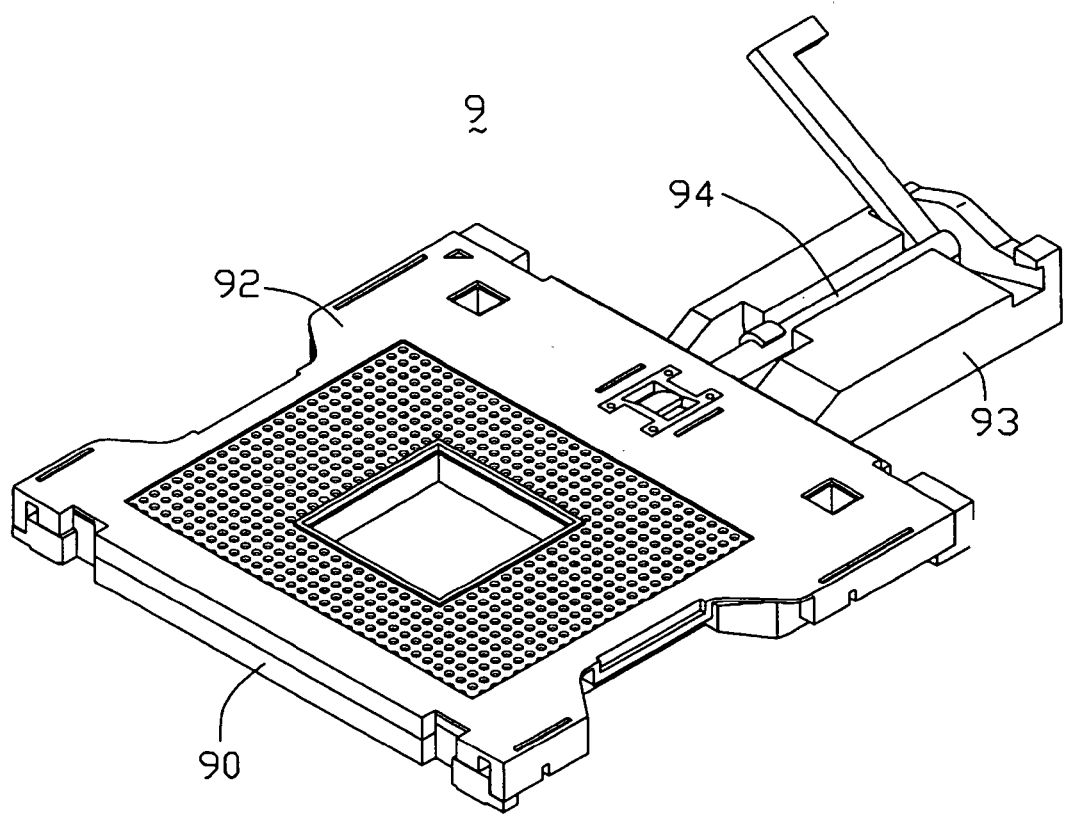
FIG. 8 is an assembled view of FIG. 7, showing a cover and an actuator of the electrical connector in respective first positions.
Figure 9:
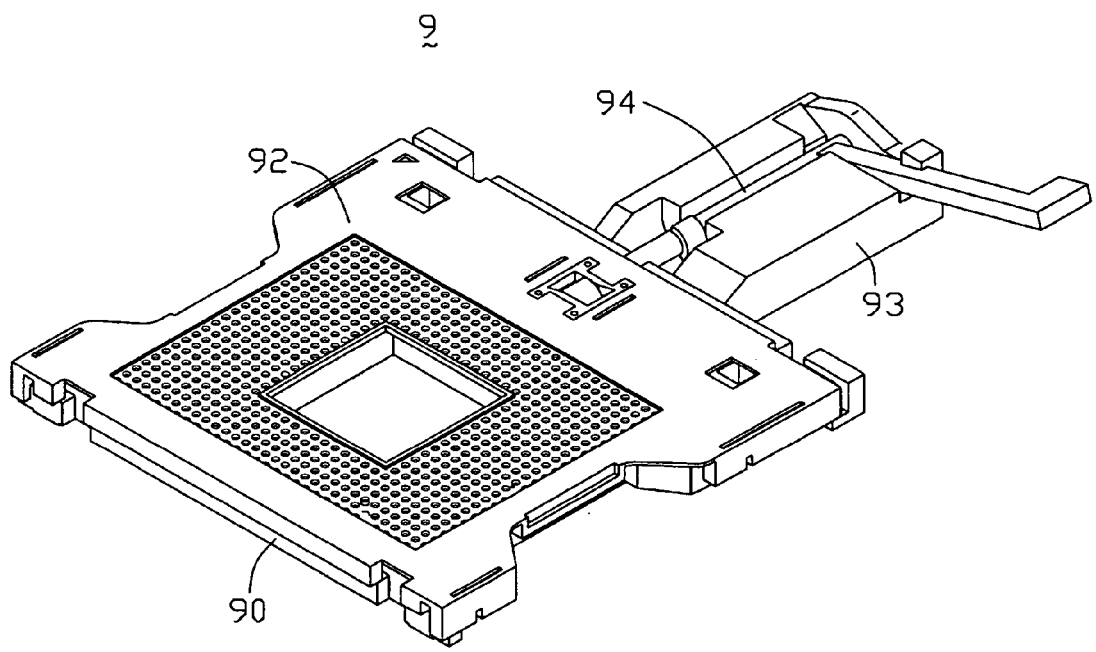
FIG. 9 is similar to FIG. 8, but showing the cover and the actuator in respective second positions.

Referring to FIGS. 5 and 6, an electrical connector 1' in accordance with the alternative embodiment of the present invention has a structure similar to that of the connector 1 of the preferred embodiment. In the alternative embodiment, the retention clip 60' comprises a base portion 61' and a first extending wall 62' and a second extending wall 63' extends perpendicularly from two opposite ends of the base portion 61'. The first extending wall 62' has a hook 621' formed at a distal end thereof. A slope (not labeled) is formed on an inner face of the first extending wall 62'. The length of the second end wall 121' of the extending portion 12' is shorter than that of the preferred embodiment.

When the retention clip 60' is engaged with the projection 1212' and the operational arm 321' of the actuator 30', the slope of the first extending wall 62' is tightly fixed on a top face of the operational arm 321', the hook 621' of the first extending wall 62' being fastened a side of the operational arm 321', and the second extending wall 63' is received in the securing slot 1221', with a sidewall of the base portion 61' being contacting a side of the projection 1212'. Thus the retention clip 60' is tightly fixed on the projection 1212' and the operational arm 321', in order to insure reliable connection between the operational arm 321' of the actuator 30' and the hook portion 1214' of the projection 1212' so that the stable and reliable electrical connection between the CPU and the PCB is ensured.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector for connecting an electronic package with a circuit substrate, the electrical connector comprising:
   an insulative base defining an end portion having a plurality of passageways for receiving a plurality of conductive terminals therein, and an extending portion extending from the end portion;
   wherein the extending portion including a first end wall adjacent to the end portion, a second end wall opposite to the first end wall, the second end wall comprising a projection protruding from an end thereof, a hook portion being inwardly formed from a top of the projection;
   a cover slidably mounted on the base;
   an actuator actuating the cover to slide along the base, the actuator comprising an operational lever, and an axle engaged with the operational lever;
   a coil spring attached to the axle, a first end of the coil spring being engaged with the operational lever to move therewith between a first position and in a second position; and
   a retention clip comprising a base portion, a first extending wall and a second extending wall respectively extending perpendicularly from two opposite ends of the base portion, the first extending wall and the second extending wall respectively engaged with a top face of the projection and received in a securing slot of the extending portion, for accurately retaining the operational lever in the second position.

2. The electrical connector as claimed in claim 1, wherein the retention clip is U-shaped.

3. The electrical connector as claimed in claim 1, wherein the first extending wall has a hook formed at a distal end thereof, and a slope is formed on an inner face of the first extending wall for engaging with the operational lever.

4. The electrical connector as claimed in claim 1, wherein the extending portion comprises a first sidewall interconnecting the first and second end walls, a second sidewall opposite to the first end wall and interconnecting the first and second end walls.

5. The electrical connector as claimed in claim 4, wherein a slope is formed on a top face of the second sidewall for positioning the operational lever.

6. The electrical connector as claimed in claim 4, wherein a guiding groove is defined in a junction of the first sidewall and the second end wall.

7. The electrical connector as claimed in claim 4, wherein the first and second sidewalls and the second end wall cooperatively define a receiving space therebetween.

8. The electrical connector as claimed in claim 7, wherein the receiving space comprises a receiving groove, a receiving recess intercommunicating between the guiding groove and the receiving groove, and a receiving slot defined below and in communication with the receiving recess.

9. The electrical connector as claimed in claim 7, wherein the coil spring comprises a main body received in the receiving groove of the extending portion, and a second end fastened in the receiving slot of the extending portion.

10. The electrical connector as claimed in claim 1, wherein the operational lever and the axle are integrally formed.

11. The electrical connector as claimed in claim 10, wherein the operational lever comprises a handle, an operational arm extending perpendicularly from one end of the handle, and an end portion extending perpendicularly from one end of the operational arm.

12. The electrical connector as claimed in claim 11, wherein a cutout is defined in one end of the operational arm adjacent to the handle for receiving the first end of the coil spring.

13. The electrical connector as claimed in claim 12, wherein a hollow column is formed in a free end of the end portion of the operational lever and engages with the axle.

14. The electrical connector as claimed in claim 13, wherein the axle comprises a cam protrusion formed in one end thereof, and a protruding portion adjacent to the operational lever.

15. An electrical connector comprising:
- an insulative base defining a plurality of passageways therein;
- a plurality of contacts disposed in the corresponding passageways, respectively;
- a cover mounted to the base and moveable relative to the base in a front-to-back direction;
- an actuator mounted to at least one of said base and said cover, to actuate the cover to move relative to the base;
- a biasing device urging said actuator to an open position so as to assure the cover reaches a correct insertion position; and
- a retention clip discrete from the base while attached thereto so as to retain the actuator in a locked position, under a resumption force derived from the biasing device, for locating the cover to be located in a closed position relative to the base.

* * * * *